US006057172A

United States Patent [19]

Tomihari

[11] Patent Number: 6,057,172

[45] Date of Patent: May 2, 2000

[54] FIELD-EMISSION CATHODE AND METHOD OF PRODUCING THE SAME

[75] Inventor: Yoshinori Tomihari, Tokyo, Japan

[73] Assignee: NEC Corporation, Tokyo, Japan

[21] Appl. No.: 09/157,946

[22] Filed: Sep. 22, 1998

[30] Foreign Application Priority Data

Sep. 26, 1997 [JP] Japan .................................... 9-262389

[51] Int. Cl.[7] ............................ H01L 21/46; H01L 21/00

[52] U.S. Cl. ................................................................ 438/20

[58] Field of Search .............................. 438/20, 945, 974, 438/976; 257/10

[56] References Cited

U.S. PATENT DOCUMENTS 5,391,259 2/1995 Cathey et al. .......................... 156/643
5,527,200 6/1996 Lee et al. ................................ 445/50
5,676,853 10/1997 Alwan ...................................... 216/11
5,804,833 9/1998 Stettner et al. .......................... 257/10
5,811,020 9/1998 Alwan ...................................... 216/42
5,949,182 9/1999 Shealy et al. .......................... 313/345

FOREIGN PATENT DOCUMENTS 7-161286 6/1995 Japan .
8-77918 3/1996 Japan .
9-106774 4/1997 Japan .

OTHER PUBLICATIONS

Spindt, C. A., "A thin–film field–emission cathode," *Communications,* pp. 3504–3505, Feb. 19, 1968.

*Primary Examiner*—Charles Bowers
*Assistant Examiner*—Evan Pert
*Attorney, Agent, or Firm*—Whitham, Curtis & Whitham

[57] ABSTRACT

In a field-emission cathode, a silicon substrate is heated to cause oxygen present therein to form silicon oxide cores. The silicon oxide cores are used as a mask for forming emitters. Because the cores each has a diameter as small as about 0.1 μm, the emitters can be density arranged. A method of producing such a field-emission cathode is also disclosed.

12 Claims, 5 Drawing Sheets

FIELD-EMISSION CATHODE AND METHOD OF PRODUCING THE SAME

BACKGROUND OF THE INVENTION

The present invention relates to a cold cathode for emitting electrons and applicable to, e.g., a field-emission display. More particularly, the present invention is concerned with a field-emission cathode for emitting electrons from its sharp tips, and a method of producing the same.

A cold cathode device structure having a number of fine cold cathodes arranged in an array (FEA hereinafter) has been reported by Spindt in Journal of Applied Physics, Vol. 39, No. 7, p. 4504, 1968. In this FEA, generally called Spindt type cold cathodes, each cold cathode consists of a conical emitter having a sharp tip and a gate electrode adjoining the emitter. The gate electrode functions to lead out a current from the emitter and to control the current.

The Spindt type FEA has an advantage that it achieves a higher current density than a hot cathode and features a small velocity distribution of emitted electrons. Another advantage of the FEA is that it reduces current noise and operates with a voltage as low as sever ten volts to 200 volts, compared to a single field-emission filter customarily included in an electron microscope. Further, while a single field-emission emitter included in an electron microscope is operable only in an ultra high vacuum atmosphere of about $10^{-8}$ Pa, the FEA can operate even in a sealed glass tube held in a vacuum atmosphere as low as about $10^{-4}$ to $10^{-6}$ Pa.

To improve the current density of the FEA, the emitters should preferably be densely arranged. However, a mask pattern used to form the emitters in a conventional procedure has a dimensional limit of the order of submicrons corresponding to the wavelength of ultraviolet rays used for exposure. This limits the density of the emitters.

Japanese Patent Laid-Open Publication No. 9-106774 discloses a field-emission display in which a mask for forming emitters is implemented by charged particles, and a method of producing the same. A high density pattern is formed for implementing self-adjustment type distance control using a Coulomb's repulsive force available with the charged particles. However, an FEA produced by such a method does not contribute to the dense arrangement of emitters because the charged particles each has a diameter of about 0.6 μm even in a preferred embodiment.

Technologies relating to the present invention are also disclosed in, e.g., Japanese Patent Laid-Open Publication Nos. 7-161286 and 8-77918.

SUMMARY OF THE INVENTION

It is therefore an object of the present invention to provide a field-emission cathode having densely arranged emitters and thereby increasing a current density, and a method of producing the same.

It is another object of the present invention to provide a field-emission cathode allowing a mask whose diameter is as small as about 0.1 μm to be easily formed in order to further enhance the dense arrangement of emitters, and a method of producing the same.

In accordance with the present invention, a method of producing a field-emission cathode including emitters formed on a silicon substrate for emitting electrons from sharp tips thereof has the steps of forming an insulation layer in the silicon substrate, subjecting the silicon substrate to heat treatment to thereby cause interlattice oxygen contained in the silicon substrate to grow into silicon oxide core, and etching the silicon substrate by using the silicon oxide cores as a mask.

Also, in accordance with the present invention, a method producing a field-emission cathode including emitters formed on a silicon substrate for emitting electrons from sharp tips thereof has the steps of forming an insulation layer in the silicon substrate, forming high oxygen concentration portions in the vicinity of portions of the surface of the silicon substrate where the insulation layer is absent, subjecting the silicon substrate to heat treatment to thereby cause oxygen in the high oxygen concentration portions to grow into silicon oxide cores, and etching the silicon substrate by using the silicon oxide cores as a mask.

BRIEF DESCRIPTION OF THE DRAWINGS

The foregoing and other objects, aspects and advantages will be better understood from the following detailed description of a preferred embodiment of the invention with reference to the drawings, in which.

Figure 1:
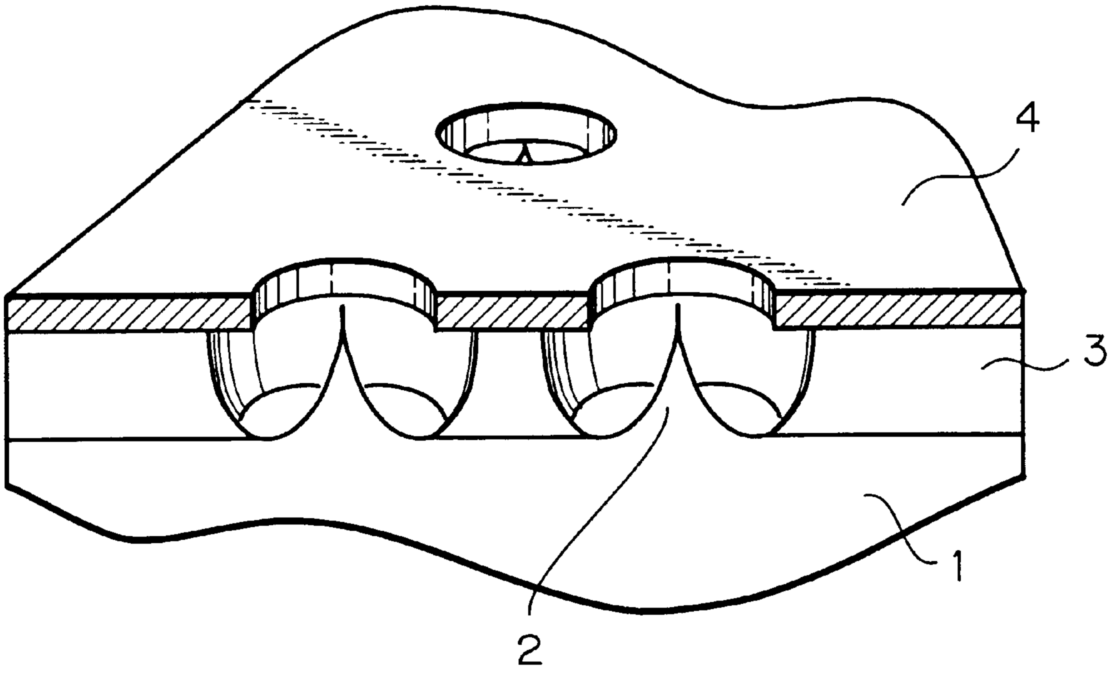
Fig. 1 PRIOR ART
FIG. 1 is a partly sectional perspective view showing a conventional field-emission cathode.

In the drawings, identical references denote identical structural elements.

DETAILED DESCRIPTION OF A PREFERRED EMBODIMENT OF THE INVENTION

To better understand the present invention, brief reference will be made to a conventional FEA, shown in FIG. 1. As shown, the FEA include conical emitters 2 formed on a silicon substrate 1 and each having a sharp tip. A gate electrode 4 adjoins the tips of the emitters 2 with the intermediary of an insulation layer 3 implemented as an oxide film. A bonding pad portion or similar connection portion, not shown, is connected to the gate electrode 4 for applying a voltage thereto.

Figure 2A:
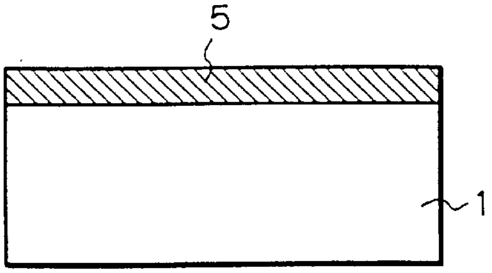
Fig.2a prior art
FIGS. 2*a*, 2*b*, 2*c*, 2*d*, 2*e*, and 2*f* show cross sectional views of a sequence of steps for producing the conventional cathode of FIG. 1.

The above FEA is produced by the following procedure. First, as shown in FIG. 2*a*, a nitride film 5 is formed on the silicon substrate 1 by CVD (Chemical Vapor Deposition). The nitride film 5 is patterned with a resist by a conventional exposure technology, although not shown specifically. Then, as shown in FIG. 2*b*, the patterned nitride film 5 is subjected to dry etching in order to form a circular mask pattern 5. As shown in FIG. 2*c*, the insulation layer 3 in the form of an oxide film is formed by thermal oxidation with the mask pattern 5 serving as a mask. As a result, the conical emitters 2 are formed below the nitride film 5, as illustrated.

Figure 2D:
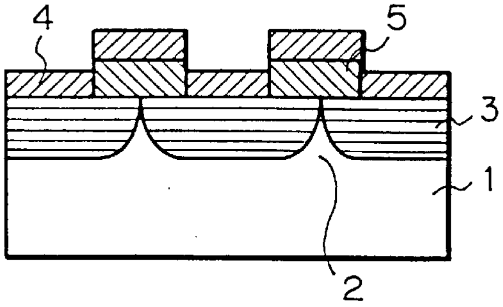
Fig.2d prior art
Figure 2B:
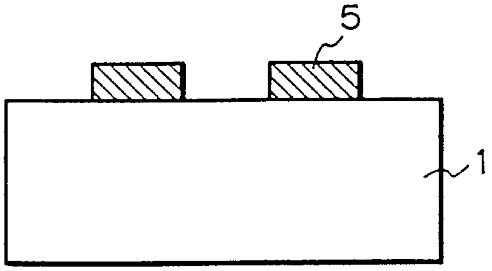
Fig.2b prior art
Figure 2E:
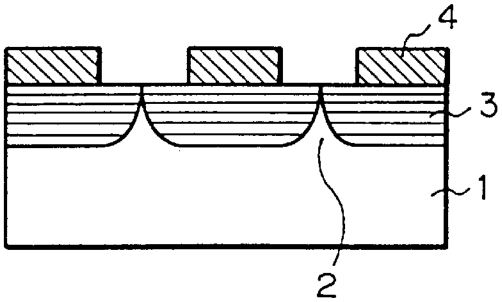
Fig.2e prior art
Figure 2C:
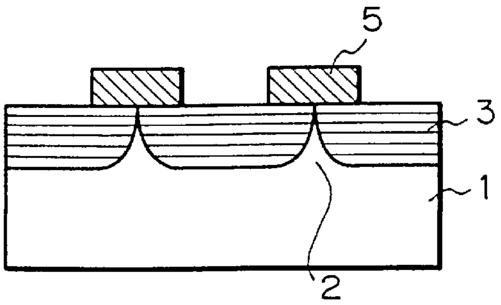
Fig.2c prior art
Figure 2F:
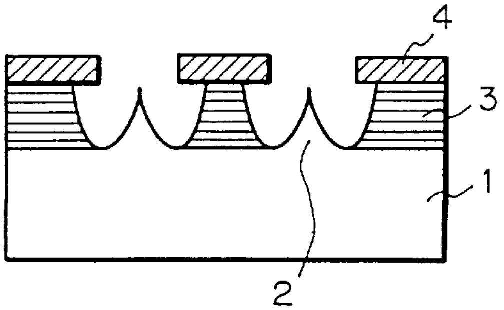
Fig.2f prior art

Subsequently, as shown in FIG. 2*d*, the gate electrode 4 is deposited on the insulation layer or oxide film 3 and nitride film 5 by vacuum evaporation. Thereafter, the nitride film 5 is removed by use of phosphoric acid or similar etchant. At this instant, the gate electrode material deposited on the nitride film 5 is also lifted off. Finally, as shown in FIG. 2*f*, the oxide film 3 around the emitters 2 is removed by use of hydrofluoric acid or similar etchant, thereby completing an FEA.

To improve the current density of the FEA, the emitters 2 should preferably by densely arranged. However, the mask pattern used to form the emitters 2 in the above procedure has a dimensional limit of the order of the submicrons corresponding to the wavelength of ultraviolet rays used for exposure. This limits the density of the emitters 2.

Figure 3:
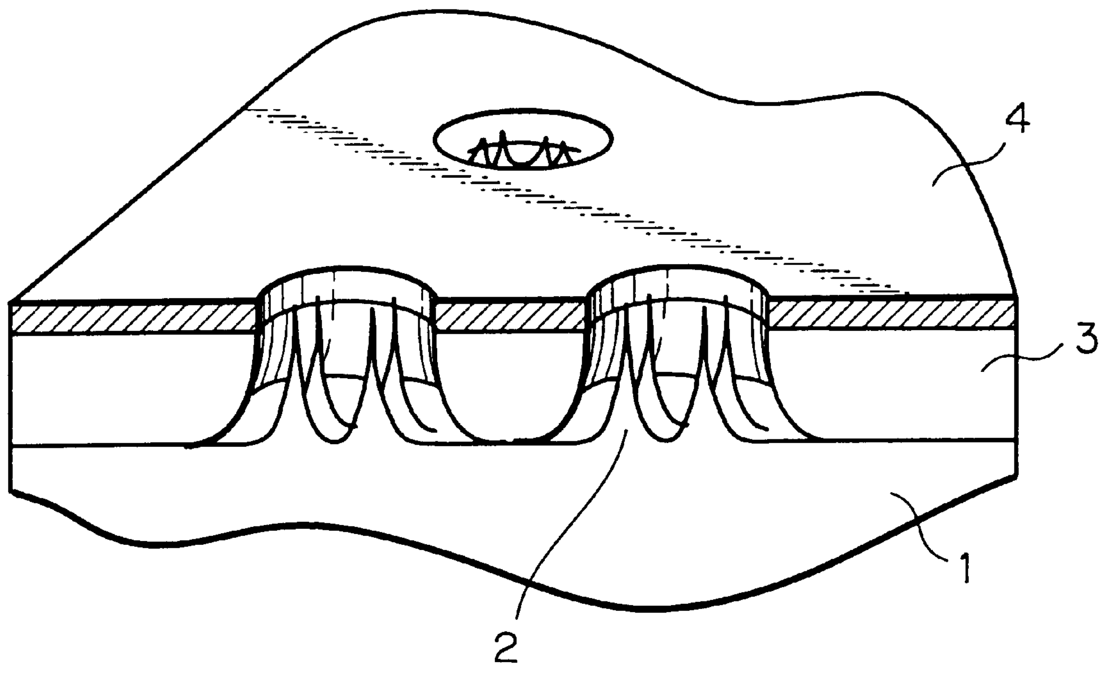
FIG. 3 is a partly sectional perspective view showing a field-emission cathode embodying the present invention.

Referring to FIG. 3, a field-emission cathode embodying the present invention is shown. As shown, the field-emission cathode is characterized in that a plurality of emitters 2 are formed in each cavity of a gate electrode 4. The cavities of the gate electrode 4 can be reduced in diameter to about 0.4 μm by a conventional exposure technology. The plurality of emitters 2 in each cavity increase the number of emission cites. In addition, the tip of each emitter 2 can be reduced in diameter in order to intensify the field strength. It is therefore possible to increase current density.

Figure 4A:
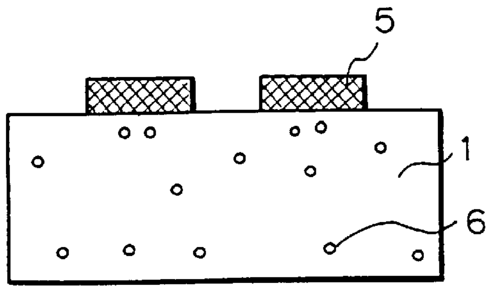
FIGS. 4*a*, 4*b*, 4*c*, 4*d*, 4*e*, and 4*f* show in cross sectional views the sequence of a method of producing the cathode of FIG. 3 and also embodying the present invention.

A method of producing a field-emission cathode also embodying the present invention will be described hereinafter with reference to FIGS. 4*a*–4*f*. First, as shown in FIG. 4*a*, a nitride film 5 is formed on a silicon substrate 1 by CVD. The silicon substrate 1 is produced by CZ(Czochralski) method containing excess interlattice oxygen 6. The nitride film 5 is etched in a preselected pattern by a conventional exposure technology with a resist, not shown, serving as a mask. At this instant, a nitride film approximately 300 Å thick, not shown, formed beforehand is present below the nitride film 5 in order to prevent the nitride film 5 form reacting with the silicon substrate 1. The substrate 1 should preferably contain interlattice oxygen in an amount of 13 to $20\times10^{17}$ atms/cm$^2$, more preferably 14 to $16\times10^{-17}$ atms/cm$^2$. With this range of interlattice oxygen, it is possible to use even a silicon substrate produced by method other than the CZ method.

Figure 4B:
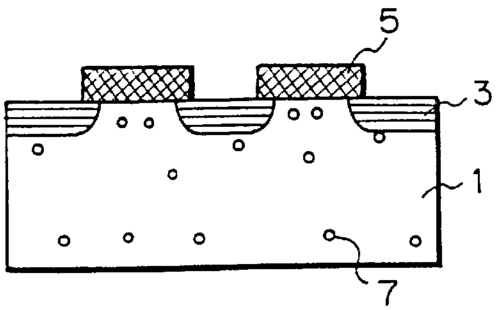

As shown in FIG. 4*b*, the substrate 1 is heated for thermal oxidation with the result that an insulation layer 3 is formed. The thermal oxidation may be implemented by any one of conventional methods effected in an oxidizing atmosphere. By the thermal oxidation, only the exposed portions of the substrate 1 are oxidized, i.e., the other portions beneath the nitride film 5 are not oxidized. Temperature, duration and other factors for the thermal oxidation are suitably adjusted in such a manner as to provide the insulation layer 3 with a desired thickness. During thermal oxidation, the excess interlattice oxygen contained in the substrate 1 are precipitated by heat and form silicon oxide cores 7. The diameter of the silicon oxide cores 7 is adjustable by controlling the duration and temperature of heating. For example, when the thermal oxidation is continued for 3 hours at 1,000° C., each core 7 has a diameter of about 0.1 μm.

Figure 4C:
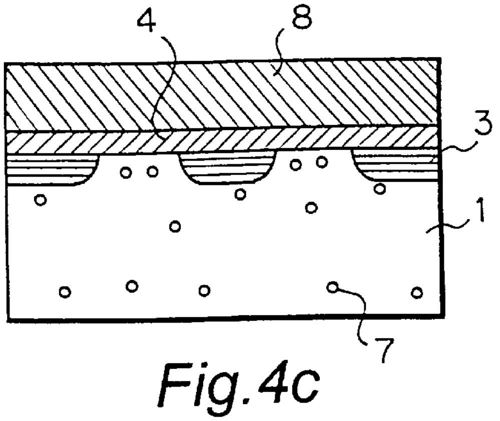
Figure 4D:
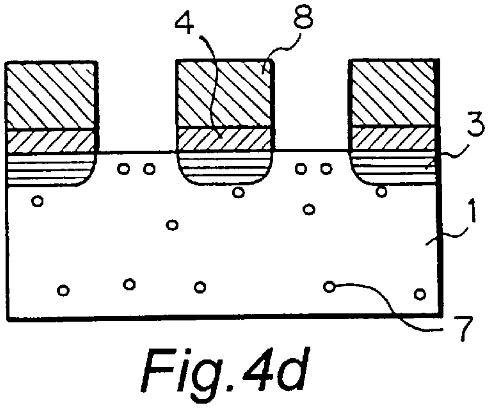
Figure 4E:
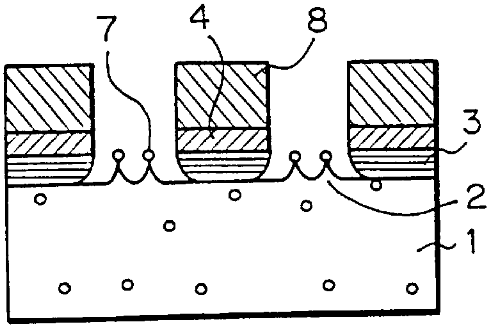

Subsequently, the nitride film 5 is removed. Then, as shown in FIG. 4*c*, the gate electrode 4 is formed by vacuum evaporation, and then a resist 8 is coated on the gate electrode 4. As shown in FIG. 4*d*, the resist 8 is patterned by a conventional exposure technology in order to form cavities of desired diameter. This is followed by the dry etching of the gate electrode 4. Thereafter, as shown in FIG. 4*e*, the substrate 1 is subjected to reactive ion etching (RIE) with the cores 7 serving as a mask. As a result, the emitters 2 are form, as also shown in FIG. 4*e*. The above RIE is effected to substantially the depth of the insulation layer 3.

Figure 4F:
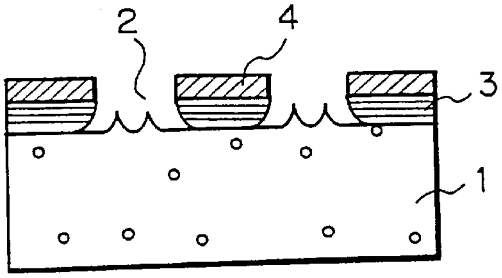

Finally, as shown in FIG. 4*f*, the resist 8 and cores 7 used as a mask are removed to compete a field-emission cathode.

The thermal oxidation used to form the insulation layer 3 may be replaced with a sequence of steps of forming an insulation layer by CVD or coating, and causing excess interlattice oxygen in the substrate 1 to separate by heat treatment for thereby forming the cores 7.

Usually, the field-emission cathode produced by the above procedure include a connecting portion via which a voltage is applied to the gate electrode 4 from the outside of the cathode. Specifically, a bonding pad portion is formed at the same time as the gate electrode 4 is patterned. A plurality of such field-emission cathodes are formed on a single silicon wafer at a time and separated by, e.g., dicing later.

Figure 5A:
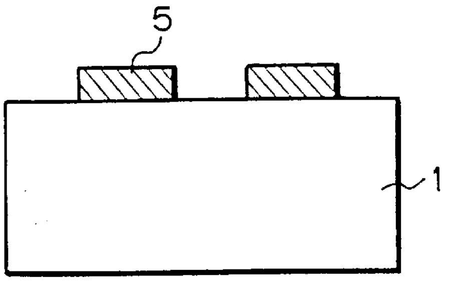
FIGS. 5*a*, 5*b*, 5*c*, 5*d*, 5*e*, 5F, 5*g*, and 5*h* show in cross sectional view the sequence of an alternative method of producing the cathode of FIG. 3.

Reference will be made to FIGS. 5*a*–5*h* for describing an alterative embodiment of the method in accordance with the present invention. First, as shown in FIG. 5*a*, the nitride film 5 is formed on the silicon substrate 1 by CVD. In the illustrative embodiment, the substrate 1 is produced by a low oxygen concentration FZ (Floating Zone) method or by DZ (Denuded Zone) treatment which provides the substrate 1 with a low oxygen concentration surface. The nitride film 5 is patterned by etching using a conventional exposure technology with a resist, not shown, serving as a mask. It is to be noted that the words "low oxygen concentration" refer to the oxygen concentration of the substrate 1 below $10\times10^{17}$ atms/cm$^2$ inclusive.

Figure 5E:
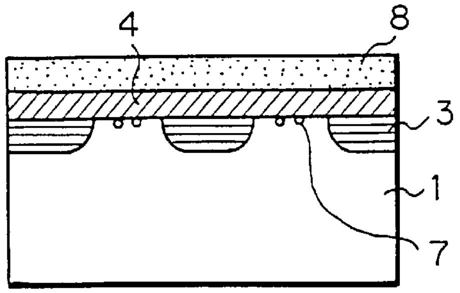
Figure 5B:
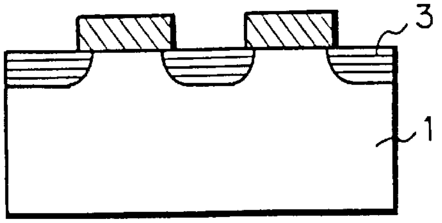

Subsequently, as shown in FIG. 5*b*, the insulation layer 3 is formed on the substrate 1 by thermal oxidation. A nitride film approximately 300 Å thick, not shown, formed beforehand is present below the nitride film 5 in order to prevent the nitride film 5 from reacting with the silicon substrate 1, as in the previous embodiment. The thermal oxidation may be implemented by any one of conventional methods effected in an oxidizing atmosphere. By the thermal oxidation, only the exposed portions of the substrate 1 are oxidized, i.e., the other portions beneath the nitride film 5 are not oxidized. The duration of the thermal oxidation is suitably adjusted in such a manner as to provide the insulation layer 3 with a desired thickness.

Figure 5F:
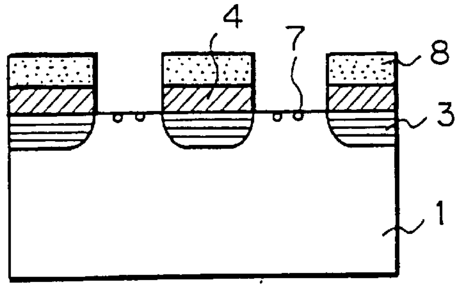
Figure 5C:
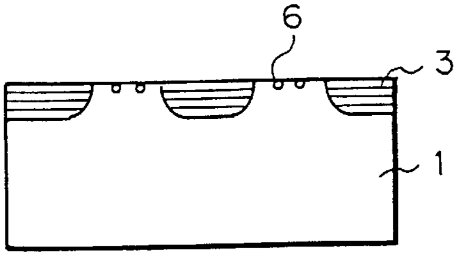

As shown in FIG. 5*c*, after the removal of the nitride film 5, oxygen 6 is introduced into the substrate 1 by ion implantation. In this case, by suitable selecting the concentration and energy of ion implantation, it is possible to control the amount of oxygen to be implanted and therefore to adjust the density and height of emitters later. It is preferable that oxygen, preferably oxygen molecule ions, be implanted by energy as low as 10 to 30 keV so as to have a peak value of about 10 to $20\times10^{17}$ atms/cm$^2$.

Figure 5G:
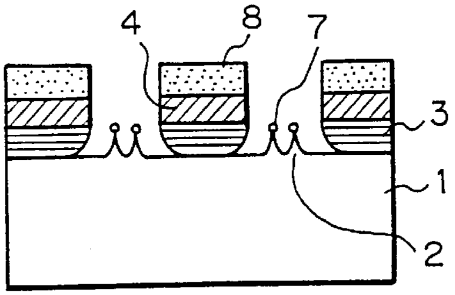
Figure 5D:
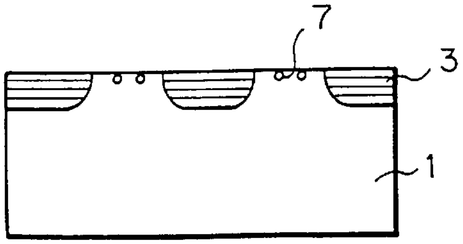

Subsequently, shown in FIG. 5*d*, the substrate 1 is subjected to heat treatment in order to cause the oxygen to form silicon oxide cores 7. The diameter of the cores 7 is adjustable by controlling the duration and temperature of heating, as stated earlier in relation to the previous embodiment.

Figure 5H:
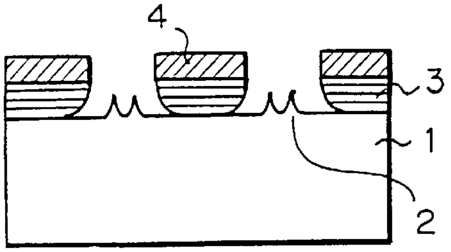

As shown in FIG. 5*e*, after the gate electrode 4 has been formed by, e.g., vacuum evaporation, the resist 8 is coated on the electrode 4. Then, as shown in FIG. 5*f*, the resist 8 is patterned by a conventional exposure technology to form cavities of desired diameter, and then the gate electrode 4 is subjected to dry etching. Thereafter, as shown in FIG. 5*g*, the substrate 1 is etched by RIE with the cores 7 serving as a mask. As a result, the emitters 2 are formed, as also shown in FIG. 5G. Finally, as shown in FIG. 5*h*, the resist 8 and cores 7 served as a mask are removed to completed a field-emission cathode.

Again, the thermal oxidation for forming the insulation layer 3 may be replaced with CVD or coating.

In this embodiment, high oxygen concentration regions are formed only in the vicinity of the surface of the substrate 1. Therefore, the silicon oxide cores 7 can be formed only in the regions closer to the surface of the substrate 1. This provides the emitters with a high aspect ratio, among others.

Specific examples of the present invention will be described hereinafter.

EXAMPLE 1

Example 1 pertains to the procedure shown in FIGS. 4*a*–4*f*. An approximately 300 Å silicon oxide layer was formed on the silicon substrate 1 produced by the CZ method. Then, a 0.1 μm thick silicon nitride film was formed on the silicon oxide layer by CVD. Subsequently, a resist was coated and then patterned by exposure and development to turn out a mask. The nitride silicon film was etched via the mask so as to leave disk-like silicon nitride films each having a diameter of 0.6 μm. Then, thermal oxidation was effected at 1000° C. for 3 hours in order to form an insulation layer in the portions not cover with the silicon nitride layer. The insulation layer has a thickness of about 1 μm. A great number of silicon oxide cored of about 0.1 μm were formed in the substrate 1.

Subsequently, the silicon nitride film was removed by an etchant containing phosphoric acid, and then a 0.2 μm thick film of Mo (molybdenum); W (tungsten) or similar metal having a high melting point was formed as a gate electrode material. Thereafter, a resist was coated and then patterned such that cavities each having a diameter of 0.4 μm corresponded to the portions where the insulation layer was absent. This was followed by dry etching a Cr (chromium) layer with the resist serving as a mask. Further, the portions of the substrate 1 exposed via the cavities were subjected to anisotropic etching using RIE. At this instant, a plurality of emitters were formed in each cavity of the gate electrode with the silicon oxide cores in the substrate serving as a mask. Finally, the resist and silicon oxide cores served as a mask were removed to complete a field-emission cathode. The above field-emission cathode was observed via an electron microscope. Four emitters, on the average, 0.8 to 1 μm high each were found in each cavity of the gate electrode. Each emitter had a tip having a diameter as small as about 0.1 μm.

When a voltage of 80 V was applied to the field-emission cathode, a current density as high as 100 Å/cm$^2$ was achieved.

EXAMPLE 2

Example 2 pertains to the procedure shown in FIG. 5*a*–5*h*. First, an about 300 Å silicon oxide layer was formed on the silicon substrate 1 produced by the FZ method. Then, a 0.1 μm thick silicon nitride film was formed on the silicon oxide layer by CVD. Subsequently, a resist was coated and then patterned by exposure and development to turn out a mask. The nitride silicon film was etched via the mask so as to leave disk-like silicon nitride films each having a diameter of 0.6 μm. Then, thermal oxidation was effected at 1,000° C. for 3 hours in order to form an insulation layer in the portions not covered with the silicon nitride layer. The insulation layer had a thickness of about 1 μm.

The silicon nitride film was removed by an etchant containing phosphoric acid, and then oxygen was introduced by ion plantation using energy of 10 keV so as to have a peak value of 10 to 20×10$^{17}$ atms/cm$^2$. Thereafter, when the substrate 1 was heated at 900° C. for 5 hours, a great number of silicon oxide cores of about 0.1 μm were formed in the vicinity of the surface of the substrate 1.

Subsequently, a 0.2 μm thick film of Mo, W or similar metal having a high melting point was formed by vacuum evaporation as a gate electrode material. Then, a resist was coated and then patterned such that cavities each having a diameter of 0.4 μm corresponded to the portions where the insulation layer was absent. This was followed by dry etching a Cr layer with the resist serving as a mask.

Further, the portions of the substrate 1 exposed via the cavities were subjected to anisotropic etching using RIE. At this instant, a plurality of emitters were formed in each cavity of the gate electrode with the silicon oxide cores in the substrate serving as a mask. Finally, the resist and silicon oxide cores served as a mask were removed to complete a field-emission cathode.

Observation via an electron microscope showed that four emitters, on the average, 0.8 to 1 μm high each were formed in each cavity of the gate electrode, as in Example 1, and that each emitter had a tip having a diameter smaller than 0.1 μm. When a voltage of 80 V was applied to the field-emission cathode, a current density as high as 100 Å/cm$^2$ was achieved.

In summary, the present invention provides a field-emission cathode and a method of producing the same capable of reducing the diameter of cores to about 0.1 μm and therefore promoting the dense arrangement of emitters. Because each emitter has a small diameter and therefore a small tip radius, there can be achieved a higher field strength, a greater amount of current, and a lower operation voltage. In addition, a plurality of emitters formed in each cavity of a gate electrode increase the number of emission cites. This allows the current density to be increased and the drive voltage to be reduced.

Various modifications will become possible for those skilled in the art after receiving the teachings of the present disclosure without departing from the scope thereof.

We claim:

1. A method of producing a field-emission cathode including emitters formed on a silicon substrate for emitting electrons from sharp tips thereof, said method comprising the steps of:

(a) forming an insulation layer in the silicon substrate;

(b) subjecting the silicon substrate to heat treatment to thereby cause interlattice oxygen contained in said silicon substrate to grow into silicon oxide cores; and (c) etching the silicon substrate by using said silicon oxide cores as a mask.

2. A method as claimed in claim 1, wherein the silicon substrate contains oxygen in an amount of 13 to 20×10$^{17}$ atms/cm$^2$ as an impurity.

3. A method as claimed in claim 1, wherein said insulation layer of step (a) is formed by one of thermal oxidation, CVD and coating.

4. A method as claimed in claim 1, wherein step (c) comprises reactive ion etching.

5. A method of producing a field-emission cathode including emitters formed on a silicon substrate for emitting electrons from sharp tips thereof, said method comprising the steps of:

(a) forming an insulation layer in the silicon substrate;

(b) forming high oxygen concentration portions in the vicinity of portions of a surface of the silicon substrate where said insulation layer is absent;

(c) subjecting the silicon substrate to heat treatment to thereby cause oxygen in said high oxygen concentration portions to grow into silicon oxide cores; and (d) etching the silicon substrate by using said silicon oxide cores as a mask.

6. A method as claimed in claim 5, wherein the silicon substrate is formed by a low oxygen concentration FZ method or DZ treatment and has an oxygen concentration of less than or equal to 10×10$^{17}$ atms/cm$^2$.

7. A method as claimed in claim 5, wherein said high oxygen concentration portions of step (b) are formed by ion implantation of oxygen.

8. A method as claimed in claim 5, wherein step (d) comprises anisotropic etching using reactive ion etching.

9. A method of producing a field-emission cathode comprising:

a silicon substrate;

emitters formed on said silicon substrate for emitting electrons from sharp tips thereof;

an insulation layer formed at portions other than said emitters and neighborhood of said emitters; and a gate electrode formed on said insulation layer and formed with cavities surrounding said emitters and including a connecting portion to which a voltage is applied from an outside of said cathode;

said method comprising the steps of:

(a) forming an insulation layer in the silicon substrate;

(b) subjecting the silicon substrate to heat treatment to thereby cause interlattice oxygen contained in said silicon substrate to grow into silicon oxide cores; and (c) etching the silicon substrate by using said silicon oxide cores as a mask.

10. A method as claimed in claim 9, wherein said cavities are formed in a plurality of arrays.

11. A method of producing a field-emission cathode comprising:

a silicon substrate;

emitters formed on said silicon substrate for emitting electrons from sharp tips thereof;

an insulation layer formed at portions other than said emitters and neighborhood of said emitters; and a gate electrode formed on said insulation layer and formed with cavities surrounding said emitters and including a connecting portion to which a voltage is applied from an outside of said cathode;

said method comprising the steps of:

(a) forming an insulation layer in the silicon substrate;

(b) forming high oxygen concentration portions in the vicinity of portions of a surface of the silicon substrate where said insulation layer is absent;

(c) subjecting the silicon substrate to heat treatment to thereby cause oxygen in said high oxygen concentration portions to grow into silicon oxide cores; and (d) etching the silicon substrate by using said silicon oxide cores as a mask.

12. A method as claimed in claim 11, wherein said cavities are formed in a plurality of arrays.

* * * * *